United States Patent [19]
Maley

[11] Patent Number: 6,081,152
[45] Date of Patent: *Jun. 27, 2000

[54] OUTPUT BUFFER WITH PROTECTIVE LIMIT OF VOLTAGE ACROSS TERMINALS OF DEVICES WITHIN THE OUTPUT BUFFER

[75] Inventor: Reading Maley, San Francisco, Calif.

[73] Assignee: Advanced Micro Devices, Inc., Sunnyvale, Calif.

[*] Notice: This patent is subject to a terminal disclaimer.

[21] Appl. No.: 09/165,489

[22] Filed: Oct. 2, 1998

[51] Int. Cl.[7] ....................................... H03K 5/08
[52] U.S. Cl. ................. 327/320; 327/112; 327/321; 327/333; 326/68; 326/81; 326/86
[58] Field of Search .................... 327/333, 309, 327/318, 319, 320, 321, 112; 326/63, 68, 80, 81, 83, 86; 361/56, 90, 91.5

[56] References Cited

U.S. PATENT DOCUMENTS

| | | | |
|---|---|---|---|
| 5,113,087 | 5/1992 | Ueno | 327/333 |
| 5,300,832 | 4/1994 | Rogers | 326/57 |
| 5,378,943 | 1/1995 | Dennard | 326/68 |
| 5,805,123 | 8/1998 | Satoh et al. | 345/60 |
| 5,864,244 | 1/1999 | Kaplinsky | 327/333 |
| 5,926,056 | 7/1999 | Morris et al. | 327/333 |
| 5,969,542 | 10/1999 | Maley et al. | 326/81 |
| 5,982,371 | 4/1999 | Maley | 326/81 |

OTHER PUBLICATIONS

"Circuit Techniques for 1.5–3.6–V Battery–Operated 64–Mb DRAM," by Yoshinobu Nakagome et al., vol. 26, No. 7, Jul. 1991 IEEE, pp. 1003–1009.

*Primary Examiner*—Timothy P. Callahan
*Assistant Examiner*—Terry L. Englund
*Attorney, Agent, or Firm*—Monica H. Choi

[57] ABSTRACT

An output buffer interfaces a digital system having devices designed for low operating voltages to an output coupled to an external system having higher operating voltages. The output buffer drives the output to one of a high output voltage and a low output voltage while limiting voltage across terminals of devices within the output buffer. The output buffer includes a pull-up stack of a first plurality of devices, coupled between a high power supply and the output, which turn on when the output is driven to the high output voltage and which turn off when the output is driven to the low output voltage. The voltage difference between the output and the high power supply is distributed across the first plurality of devices when the output is driven to the low output voltage. The output buffer further includes a pull-down stack of a second plurality of devices, coupled between a low power supply and the output, which turn on when the output is driven to the low output voltage and which turn off when the output is driven to the high output voltage. The voltage difference between the output and the low power supply is distributed across the second plurality of devices when the output is driven to the high output voltage. The output buffer further includes a clamping circuit, coupled to the output and to a predetermined node of the first and second plurality of devices, for limiting voltage across terminals of each of the first and second plurality of devices by discharging down the predetermined node when the output is driven to the low output voltage and by charging up the predetermined node when the output is driven to the high output voltage.

19 Claims, 4 Drawing Sheets

OUTPUT BUFFER WITH PROTECTIVE LIMIT OF VOLTAGE ACROSS TERMINALS OF DEVICES WITHIN THE OUTPUT BUFFER

TECHNICAL FIELD

This invention relates to output buffers for digital systems, and more particularly, to an output buffer which limits the voltage across terminals of devices within the output buffer in order to protect such devices.

BACKGROUND OF THE INVENTION

A long-recognized important objective in the constant advancement of digital IC (Integrated Circuit) technology is faster speed and lower power dissipation. For example, a digital system such as a modem microprocessor is comprised of MOSFETs (Metal Oxide Semiconductor Field Effect Transistors) operating at a low rail-to-rail voltage of 1.5V. In addition, at such a low operating voltage, the gate oxide is designed to be in the range of tens of angstroms (Å). Such a thin gate oxide is advantageous for faster switching speed of the MOSFETs.

Furthermore, the digital system typically must interface with other electronic systems which operate at higher voltages. For example, typical communications systems operate at a rail-to-rail voltage of 3.3V. However, a thin gate oxide of the MOSFET in the digital system may be adversely affected by coupling with the higher operating voltage of an external system. The gate oxide may break down if the gate is coupled to a high operating voltage or the operating life time of a MOSFET having the thin gate oxide may be diminished if the gate is coupled to a high operating voltage.

Nevertheless, an output buffer, within a digital system having MOSFETs with thin gate oxides, interfaces the digital system to an external system with higher operating voltage. The output buffer drives an output, which couples to the external system, to the higher operating voltage. However, since the output buffer is comprised of MOSFETs having thin gate oxide, a mechanism is desired for protecting the MOSFETs in the output buffer while the output buffer drives the output to a higher operating voltage of the external system.

SUMMARY OF THE INVENTION

Accordingly, devices within the output buffer of the present invention are configured such that a voltage across the terminals of such devices are limited.

In a general aspect, the present invention is an output buffer for driving an output to one of a high output voltage and a low output voltage while limiting voltage across terminals of the devices within the output buffer. The output buffer of the present invention comprises a pull-up stack of a first plurality of devices coupled between a high power supply and the output. The pull-up stack turns on when the output is driven to the high output voltage and turns off when the output is driven to the low output voltage. A voltage difference between the output and the high power supply is distributed across the first plurality of devices when the output is driven to the low output voltage.

The output buffer of the present invention also comprises a pull-down stack of a second plurality of devices coupled between a low power supply and the output. The pull-down stack turns on when the output is driven to the low output voltage and turns off when the output is driven to the high output voltage. A voltage difference between the output and the low power supply is distributed across the second plurality of devices when the output is driven to the high output voltage.

In addition, a clamping circuit, coupled to the output and to a predetermined node of the first and second plurality of devices, limits voltage across terminals of each of the first and second plurality of devices by discharging down the predetermined node when the output is driven to the low output voltage and by charging up the predetermined node when the output is driven to the high output voltage.

The present invention may be used to particular advantage when the digital system having the output buffer of the present invention is implemented with MOSFETs (Metal Oxide Semiconductor Field Effect Transistors). In that case, the pull-up stack is comprised of a plurality of PMOSFETs (P-channel Metal Oxide Semiconductor Field Effect Transistors) coupled in series between the high power supply and the output. The gate of a first PMOSFET of the plurality of PMOSFETs is coupled to a high voltage input. The gate of a second PMOSFET of the plurality of PMOSFETs is coupled to a high reference voltage. The gate of a third PMOSFET of the plurality of PMOSFETs is coupled to the clamping circuit at the predetermined node, and the drain of the third PMOSFET is coupled to the output.

In another aspect of the present invention, the pull-down stack is comprised of a plurality of NMOSFETs (N-channel Metal Oxide Semiconductor Field Effect Transistors) coupled in series between the low power supply and the output. The gate of a first NMOSFET of the plurality of NMOSFETs is coupled to a low voltage input. The gate of a second NMOSFET of the plurality of NMOSFETs is coupled to a low reference voltage. The gate of a third NMOSFET of the plurality of NMOSFETs is coupled to the clamping circuit at the predetermined node, and the drain of the third NMOSFET is coupled to the output.

The present invention may be used to particular advantage when the clamping circuit further comprises at least one diode connected PMOSFET, coupled between the output and the predetermined node, that turns on to discharge down the predetermined node when the output is driven to the low output voltage. Furthermore, the clamping circuit includes at least one diode connected NMOSFET, coupled between the output and the predetermined node, that turns on to charge up the predetermined node when the output is driven to the high output voltage.

With a clamping circuit, the voltage at the gate oxide each of the MOSFETs within an output buffer is limited to appropriately protect MOSFETs with thin gate oxides. Thus, the voltage range which may be required by an external system between the low output voltage to the high output voltage may be significantly higher than the operating voltage range of the digital system having the output buffer of the present invention.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1, 2, 3, and 4 refer to elements having similar structure and function.

DETAILED DESCRIPTION

The present invention is described for digital systems and output buffers implemented with CMOSFETs (Complementary Metal Oxide Semiconductor Field Effect Transistors). However, as would be apparent to one of ordinary skill in the art from the description herein, the present invention may be used for digital systems and output buffers implemented with any other type of devices having similar operating characteristics as CMOSFETs. In addition, the present invention is described with example voltage levels. However, as would be apparent to one of ordinary skill in the art from the description herein, the present invention may be used for other example voltage levels.

Figure 1:
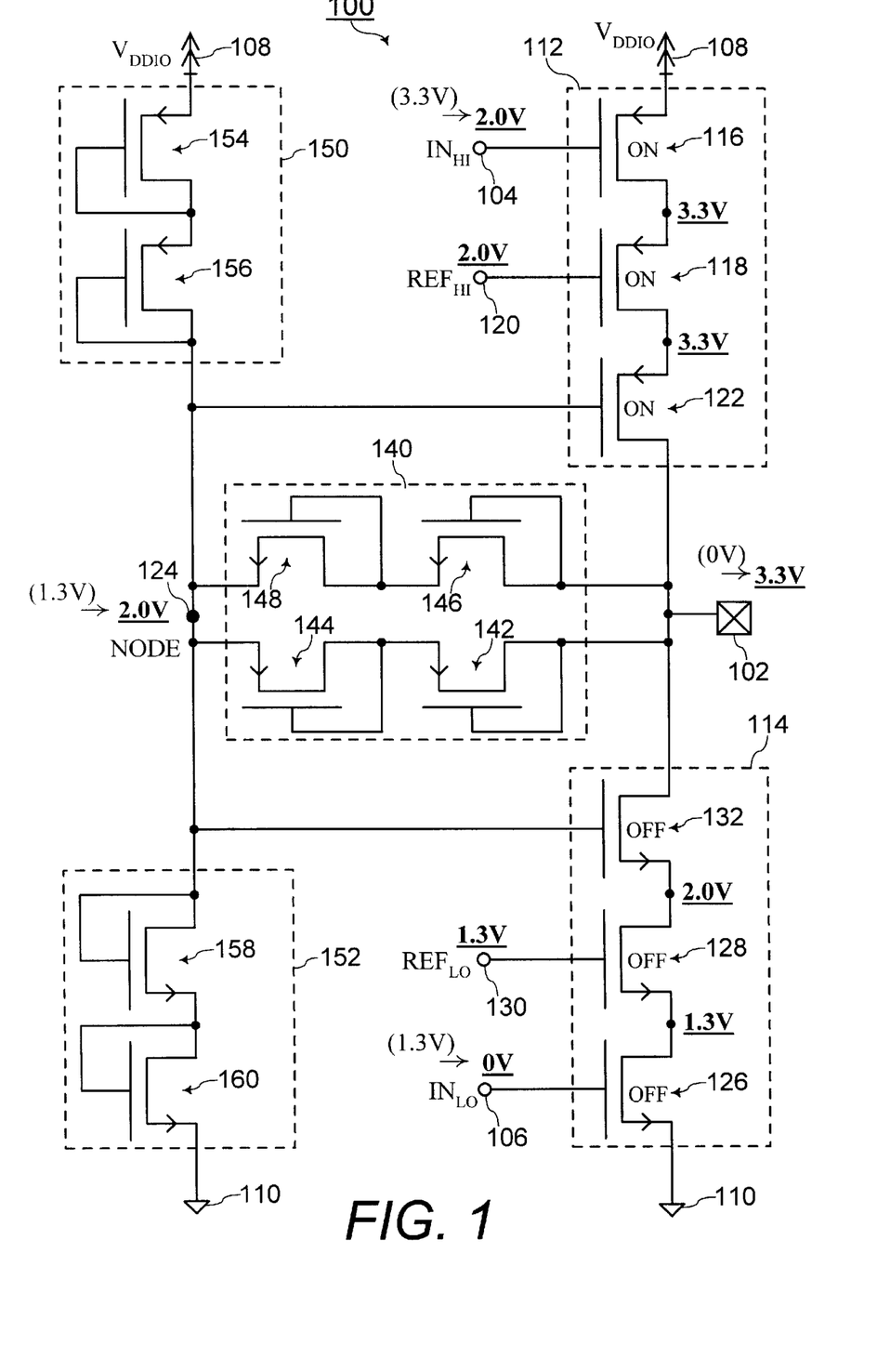
FIG. 1 shows a first embodiment of the present invention when the output buffer of the present invention drives the output to a high output voltage.

Referring to FIG. 1, an output buffer 100 of the present invention interfaces a digital system (such as a modern microprocessor) having lower operating voltage range to an external system (such as a communications system) having higher operating voltage range. For example, the digital system having output buffer 100 may operate on a 1.5V core voltage range while the output buffer 100 interfaces to a communications system operating on a 3.3V voltage range. The MOSFETs (Metal Oxide Semiconductor Field Effect Transistors) within the digital system and the output buffer 100 have thin gate oxides of tens of angstroms (Å). Thus, the voltage across terminals of the MOSFETs are limited for protection from breakdown and/or device degradation.

The output buffer 100 of FIG. 1 drives an output 102 between 0V and 3.3V. The output 102 may be an output pad which is coupled to an external system such as a communications system. The output buffer 100 also includes a high voltage input 104 and a low voltage input 106. The high voltage input 104 switches between 2.0V and 3.3V, and the low voltage input 106 switches between 0V and 1.3V. When the output 102 is switched to 0V, the high voltage input 104 is switched to 3.3V, and the low voltage input 106 is switched to 1.3V. When the output 102 is switched to 3.3V, the high voltage input 104 is switched to 2.0V, and the low voltage input 106 is switched to 0V.

The output buffer 100 of FIG. 1 is also coupled to a high power supply 108 $V_{DDIO}$=3.3V and to a low power supply 110 of ground or 0V. Such power supplies 108 and 110 may be provided via pins external to the digital system having the output buffer 100.

The output buffer 100 is comprised of a pull-up stack 112 (shown within dashed lines) of a first plurality of devices and a pull-down stack 114 (shown within dashed lines) of a second plurality of devices. In the embodiment of FIG. 1, the first plurality of devices in the pull-up stack 112 is a plurality of PMOSFETs (P-channel Metal Oxide Semiconductor Field Effect Transistors) coupled in series between the high power supply 108 and the output 102. The source of a first PMOSFET 116 is coupled to the high power supply 108, and the gate of the first PMOSFET 116 is coupled to the high voltage input 104. The drain of the first PMOSFET 116 is coupled to the source of a second PMOSFET 118.

The gate of the second PMOSFET 118 is coupled to a high reference voltage 120. For the example of the output range of 0V to 3.3V, the high reference voltage is 2.0V and may be provided by any type of reference voltage source known to one of ordinary skill in the art. The drain of the second PMOSFET 118 is coupled to the source of a third PMOSFET 122. The gate of the third PMOSFET 122 is coupled to a predetermined node 124, and the drain of the third PMOSFET 122 is coupled to the output 102.

In the embodiment of FIG. 1, the second plurality of devices in the pull-down stack 114 is a plurality of NMOSFETs (N-channel Metal Oxide Semiconductor Field Effect Transistors) coupled in series between the low power supply 110 and the output 102. The source of a first NMOSFET 126 is coupled to the low power supply 110, and the gate of the first NMOSFET 126 is coupled to the low voltage input 106. The drain of the first NMOSFET 126 is coupled to the source of a second NMOSFET 128.

The gate of the second NMOSFET 128 is coupled to a low reference voltage 130. For the example of the output range of 0V to 3.3V, the low reference voltage is 1.3V and may be provided by any type of reference voltage source known to one of ordinary skill in the art. The drain of the second NMOSFET 128 is coupled to the source of a third NMOSFET 132. The gate of the third NMOSFET 132 is coupled to the predetermined node 124, and the drain of the third NMOSFET 132 is coupled to the output 102.

Additionally, the output buffer 100 further comprises a clamping circuit 140 (shown within dashed lines) coupled between the output 102 and the predetermined node 124. In the embodiment of FIG. 1, the clamping circuit 140 is comprised of a plurality of diode connected PMOSFETs that are coupled in series between the output 102 and the predetermined node 124. A first diode connected PMOSFET 142 and a second diode connected PMOSFET 144 are coupled in series between the output 102 and the predetermined node 124. In addition, a plurality of diode connected NMOSFETs are coupled in series between the output 102 and the predetermined node 124. A first diode connected NMOSFET 146 and a second diode connected NMOSFET 148 are coupled in series between the output 102 and the predetermined node 124.

Furthermore, the clamping circuit may further include a pull-up bleeding circuit 150 (shown within dashed lines) and a pull-down bleeding circuit 152 (shown within dashed lines). In the embodiment of FIG. 1, the pull-up bleeding circuit 150 is comprised of a first diode-connected PMOSFET 154 and a second diode connected PMOSFET 156 that are coupled in series between the high power supply 108 and the predetermined node 124. The pull-down bleeding circuit 152 is comprised of a first diode-connected NMOSFET 158 and a second diode connected NMOSFET 160 that are coupled in series between the low power supply 110 and the predetermined node 124.

The operation of the output buffer 100 of the present invention is now described. Referring to FIG. 1, assume that the output is driven to a high output voltage of 3.3V from an initial low output voltage of 0V. In that case, the high voltage input 104 switches from 3.3V to 2.0V, and the low voltage input 106 switches from 1.3V to 0V. These voltages at the voltage inputs 104 and 106 may be generated by level shifters as disclosed in a patent application entitled "Level Shifter with Protective Limit of Voltage Across Terminals of Devices within the Level Shifter" with Ser. No. 09/165,911 and filed concurrently herewith and having common inventor and assignee herewith. This patent application with Ser. No. 09/165,911 is incorporated herein by reference.

Referring to FIG. 1, with 0V at the low voltage input 106, the first NMOSFET 126 and thus the second NMOSFET 128 and the third NMOSFET 132 of the pull-down stack 114 are turned off. With 2.0V at the high voltage input 104, the first PMOSFET 116 and thus the second PMOSFET 118 and the third PMOSFET 122 of the pull-up stack 112 are turned on such that the output 102 is charged to the high output voltage of 3.3V.

As the output 102 charges up to the high output voltage of 3.3V, the predetermined node 124 is initially at 1.3V. Because of this large voltage drop of 2.0V across the clamping circuit 140, the diode connected NMOSFETs 146 and 148 within the clamping circuit 140 turn on to charge up the predetermined node 124. The predetermined node charges up toward 2.0V. When the voltage at the predetermined node reaches 2.0V, the voltage difference between the output 102 and the predetermined node 124 is approximately $2V_{TH}$ of the NMOSFETs 146 and 148 within the clamping circuit 140. Thus, an equilibrium is reached, and the predetermined node 124 remains at 2.0V while the NMOSFETs 146 and 148 turn back off.

In this manner, with the predetermined node 124 at 2.0V, the gate of the third PMOSFET 122 within the pull-up stack 112 and the gate of the third NMOSFET 132 within the pull-down stack 114 are raised to 2.0V. With the high output voltage of 3.3V at the drain of those transistors, a higher voltage of 2.0V at their gates limits the voltage across the gate to drain terminals of those transistors. Thus, the clamping circuit 140 charges up the predetermined node 124 in reaction to the high output voltage at the output 102 to protect the gates of the PMOSFET 122 and the NMOSFET 132 that are coupled to the output 102 which has a high voltage range. With the clamping circuit 140, the voltage across the gate to drain terminals of the PMOSFET 122 and the NMOSFET 132 is approximately 1.3V. The voltage across terminals of the MOSFETs within the digital system having the output buffer 100 are limited to be below approximately 1.65V to protect the thin gate oxide of those MOSFETs from breakdown or degradation.

In addition, voltage across terminals (i.e., gate to drain terminals or gate to source terminals) of the other MOSFETs within the output buffer 100 are also limited to be below approximately 1.65V. In the pull-down stack 114, because the NMOSFETs 126, 128, and 132 within the pull-down stack 114 are turned off, the source terminals of each NMOSFET charges to a voltage such that the gate to source voltage is approximately 0V. (Note that the gate to source voltage is the respective $V_{TH}$ which is approximately several hundred millivolts for each of the NMOSFETs 126, 128, and 132. However, for simplicity of illustration and description, the gate to source voltage for each of the NMOSFETs 126, 128, and 132 is approximated to be 0V in the description herein.) For the first NMOSFET 126, the gate to source voltage $V_{GS}$ is approximately 0V. With a reference voltage of 1.3V at the gate of the second NMOSFET 128, the source of the second NMOSFET 128 charges to 1.3V. Thus, the $V_{GS}$ of the second NMOSFET 128 is approximately 0V, and the gate to drain voltage of the first NMOSFET 126 is −1.3V. With the voltage of 2.0V at the predetermined node 124 and thus at the gate of the third NMOSFET 132, the source of the third NMOSFET 132 charges to 2.0V. Thus, the $V_{GS}$ of the third NMOSFET 132 is approximately 0V, and the gate to drain voltage of the second NMOSFET 128 is −0.7V. In this manner, the voltage difference between the output 102 and the low power supply 110 is thus distributed across the NMOSFETs 126, 128, and 132 of the pull-down stack 114 when the output 102 is driven to the high output voltage of 3.3V.

In the pull-up stack 112, because the PMOSFETs 116, 118, and 122 within the pull-up stack 112 are turned on, the drain and source terminals of each the PMOSFETs 116, 118, and 122 are at 3.3V. The gate voltage of each of the PMOSFETs 116, 118, and 122 is 2.0V. Thus, the voltage across the gate to source terminals or across the gate to drain terminals of each of the PMOSFETs 116, 118, and 122 is −1.3V.

For the clamping circuit 140, a voltage drop of 1.3V is distributed across the diode connected PMOSFETs 142 and 144 and the diode connected NMOSFETs 146 and 148 within the clamping circuit 140. Thus, voltage across the gate to source terminals of such diode connected transistors are limited to be below 1.65V.

The pull-up bleeding circuit 150 bleeds charge on to the predetermined node 124 from the high power supply 108 to maintain voltage at the predetermined node 124 above a minimum voltage (typically near the low reference voltage of 1.3V). Otherwise without the pull-up bleeding circuit 150, if the voltage at the predetermined node 124 falls below the minimum voltage, then the circuit 100 of FIG. 1 may not recover to proper operation. Similarly, the pull-down bleeding circuit 152 bleeds charge away from the predetermined node 124 to the low power supply 110 to maintain voltage at the predetermined node 124 below a maximum voltage (typically near the high reference voltage of 2.0V). Otherwise without the pull-down bleeding circuit 152, if the voltage at the predetermined node 124 rises above the maximum voltage, then the circuit 100 of FIG. 1 may not recover to proper operation.

In addition, the pull-up bleeding circuit 150 and the pull-down bleeding circuit 152 ensure proper channel formation within the MOSFETs 142, 144, 146, and 148 within the clamping circuit 140.

When the predetermined node 124 is charged up to 2.0V, a voltage of 2.0V is distributed across the diode connected NMOSFETs 158 and 160 in the pull-down bleeding circuit 152. The voltage across the gate to source terminals of each of the NMOSFETs 158 and 160 is approximately 1.0V. A voltage of 1.3V is distributed across the diode connected PMOSFETs 154 and 156 in the pull-up bleeding circuit 150. The voltage across the gate of source terminals of each of the PMOSFETs 154 and 156 is approximately 0.65V. Thus, the voltage across the gate to source terminals of each transistor in the bleeding circuits 150 and 152 is limited to be below 1.65V.

In this manner, the output buffer 100 drives the output 102 to a high output voltage of 3.3V while limiting the gate oxide voltage of each of the MOSFETs within the output buffer 100 to be below the voltage of 1.65V. Thus, the output buffer may be implemented using thin gate oxide MOSFETs designed for use in a digital system having low operating voltages.

Figure 2:
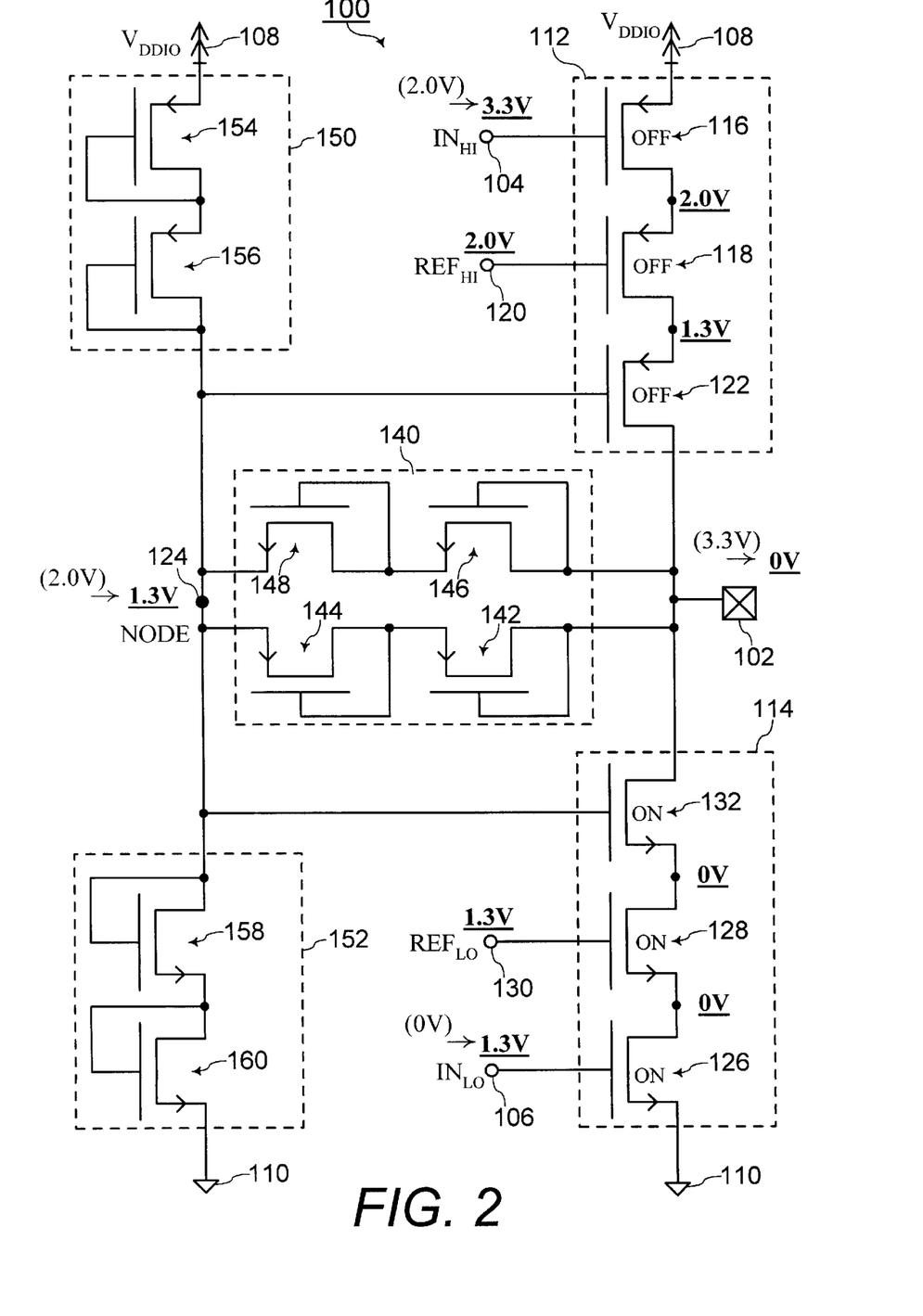
FIG. 2 shows the first embodiment of the present invention as shown in FIG. 1 when the output buffer of the present invention drives the output to a low output voltage.

Similarly, FIG. 2 shows the operation of the output buffer 100 of FIG. 1 when the output 102 is driven to a low output voltage of 0V. Elements having the same reference number in FIGS. 1 and 2 refer to elements having similar structure and function.

For the output 102 to be driven to the low output voltage of 0V from an initial high output voltage of 3.3V, the high voltage input 104 switches from 2.0V to 3.3V, and the low voltage input 106 switches from 0V to 1.3V. These voltages at the voltage inputs 104 and 106 may be generated by level shifters as disclosed in the patent application entitled "Level Shifter with Protective Limit of Voltage Across Terminals of Devices within the Level Shifter" with Ser. No. 09/165,911 and filed concurrently herewith and having common inventor and assignee herewith. This patent application with Ser. No. 09/165,911 is incorporated herein by reference.

Referring to FIG. 2, with 3.3V at the high voltage input 104, the first PMOSFET 116 and thus the second PMOSFET 118 and the third PMOSFET 122 of the pull-up stack 112 are turned off. With 1.3V at the low voltage input 106, the first NMOSFET 126 and thus the second NMOSFET 128 and the third NMOSFET 132 of the pull-down stack 114 are turned on such that the output 102 is discharged to the low output voltage of 0V.

As the output 102 discharges down to the low output voltage of 0V, the predetermined node 124 is initially at 2.0V. Because of this large voltage drop of 2.0V across the clamping circuit 140, the diode connected PMOSFETs 142 and 144 within the clamping circuit 140 turn on to discharge down the predetermined node 124. The predetermined node discharges down toward 1.3V. When the voltage at the predetermined node reaches 1.3V, the voltage difference between the output 102 and the predetermined node 124 is approximately $2V_{TH}$ of the PMOSFETs 142 and 144 within the clamping circuit 140. Thus, an equilibrium is reached, and the predetermined node 124 remains at 1.3V while the PMOSFETs 142 and 144 turn back off.

In this manner, with the predetermined node 124 at 1.3V, the gate of the third PMOSFET 122 within the pull-up stack 112 and the gate of the third NMOSFET 132 within the pull-down stack 114 are lowered to 1.3V. With the low output voltage of 0V at the drain of those transistors, a lower voltage of 1.3V at the gates of those transistors limits the voltage across the gate to drain terminals of those transistors. Thus, the clamping circuit 140 discharges down the predetermined node 124 in reaction to the low output voltage at the output 102 to protect the gates of the PMOSFET 122 and the NMOSFET 132 that are coupled to the output 102 which has a high voltage range. With the clamping circuit 140, the voltage across the gate to drain terminals of the PMOSFET 122 and the NMOSFET 132 is approximately 1.3V. The voltage across terminals of the MOSFETs within the digital system having the output buffer 100 are limited to be below approximately 1.65V to protect the thin gate oxide of those transistors from breakdown or degradation.

Similar to the operation of the output buffer 100 in FIG. 1, voltage across terminals (i.e., gate to drain terminals or gate to source terminals) of the other MOSFETs within the output buffer 100 are also limited to be below approximately 1.65V. In the pull-up stack 112, because the PMOSFETs 116, 118, and 122 within the pull-up stack 112 are turned off, the source terminals of each PMOSFET charges to a voltage such that the gate to source voltage is approximately 0V. (Note that the gate to source voltage is the respective $V_{TH}$ which is approximately several hundred millivolts for each of the PMOSFETs 116, 118, and 122. However, for simplicity of illustration and description, the gate to source voltage for each of the PMOSFETs 116, 118, and 122 is approximated to be 0V in the description herein.)

For the first PMOSFET 116, the gate to source voltage $V_{GS}$ is approximately 0V. With a high reference voltage of 2.0V at the gate of the second PMOSFET 118, the source of the second PMOSFET 118 charges to 2.0V. Thus, the $V_{GS}$ of the second PMOSFET 118 is approximately 0V, and the gate to drain voltage of the first PMOSFET 116 is 1.3V. With the voltage of 1.3V at the predetermined node 124 and thus at the gate of the third PMOSFET 122, the source of the third PMOSFET 122 charges to 1.3V. Thus, the $V_{GS}$ of the third PMOSFET 122 is approximately 0V, and the gate to drain voltage of the second PMOSFET 118 is 0.7V. In this manner, the voltage difference between the output 102 and the high power supply 108 is thus distributed across the PMOSFETs of the pull-up stack 112 when the output 102 is driven to the low output voltage of 0V.

In the pull-down stack 114, because the NMOSFETs 126, 128, and 132 within the pull-down stack 114 are turned on, the drain and source terminals of each the NMOSFETs 126, 128, and 132 are at 0V. The gate voltage of each of the NMOSFETs 126, 128, and 132 is 1.3V. Thus, the voltage across the gate to source terminals or across the gate to drain terminals of each of the NMOSFETs 126, 128, and 132 is 1.3V.

The voltage across terminals of the MOSFETs within the clamping circuit 140, the pull-up bleeding circuit 150, and the pull-down bleeding circuit 152 in FIG. 2 are limited in similar manner as described herein in relation to FIG. 1.

In this manner, the output buffer 100 drives the output 102 to a low output voltage of 0V while limiting the gate oxide voltage of each of the MOSFETs within the output buffer 100 to be below the voltage of 1.65V. Thus, the output buffer may be implemented using thin gate oxide MOSFETs designed for use in a digital system having low operating voltages.

Figure 3:
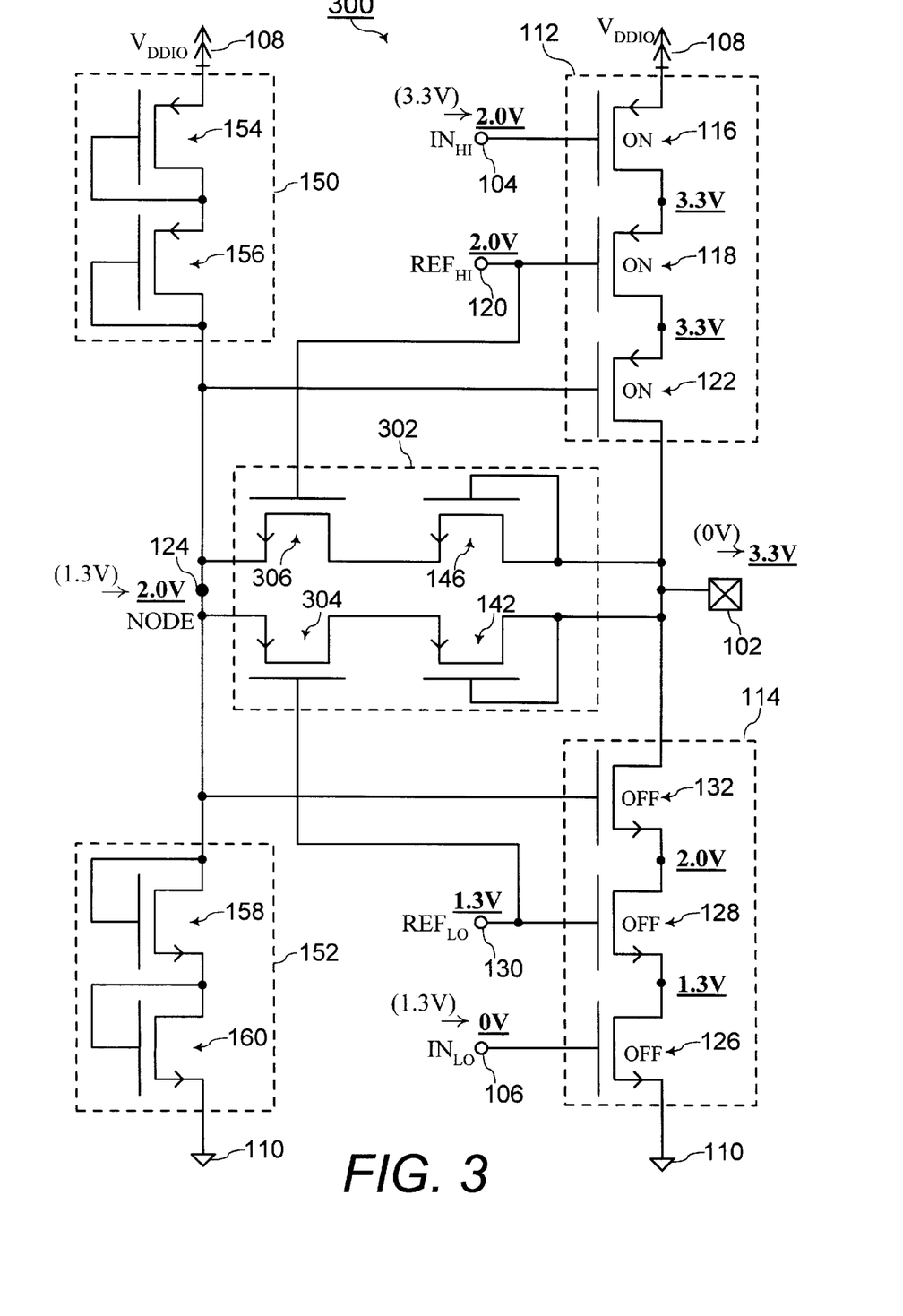
FIG. 3 shows a second embodiment of the present invention when the output buffer of the present invention drives the output to a high output voltage.

Referring to FIG. 3, an alternative embodiment of an output buffer 300 is shown. The output buffer 300 of FIG. 3 is similar to the output buffer 100 of FIG. 1. Elements having the same reference number in FIGS. 1, 2, and 3 refer to elements having similar structure and function. FIG. 3 shows the operation of the output buffer 300 when the output 102 is driven to a high output voltage of 3.3V. The pull-up stack 112, the pull-down stack 114, the pull-up bleeding circuit 150, and the pull-down bleeding circuit 152 in the output buffer 300 of FIG. 3 operate in similar manner to those in the output buffer 100 of FIG. 1 when the output 102 is driven to the high output voltage of 3.3V.

However, the clamping circuit 302 of FIG. 3 is different from the clamping circuit 140 of FIGS. 1 and 2. The clamping circuit 302 includes a reference connected PMOSFET 304. The gate of the reference connected PMOSFET 304 is coupled to the low reference voltage 130, and the source of the referenced connected PMOSFET 304 is coupled to the predetermined node 124. The drain of the reference connected PMOSFET 304 is coupled in series with the first diode connected PMOSFET 142 within the clamping circuit 302.

The clamping circuit 302 also includes a reference connected NMOSFET 306. The gate of the reference connected NMOSFET 306 is coupled to the high reference voltage 120, and the source of the referenced connected NMOSFET 306 is coupled to the predetermined node 124. The drain of the reference connected NMOSFET 306 is coupled in series with the first diode connected NMOSFET 146 within the clamping circuit 302.

Referring to FIG. 3, as the output 102 charges up to the high output voltage of 3.3V, the predetermined node 124 is initially at 1.3V. Because of this large voltage drop of 2.0V across the clamping circuit 302, the diode connected NMOSFET 146 and the reference connected NMOSFET 306 within the clamping circuit 302 turn on to charge up the predetermined node 124. Because the gate of the reference connected NMOSFET 306 is coupled to the high reference voltage of 2.0V, the predetermined node charges up toward 2.0V when the reference connected NMOSFET 306 and thus the diode connected NMOSFET 146 turn back off.

Figure 4:
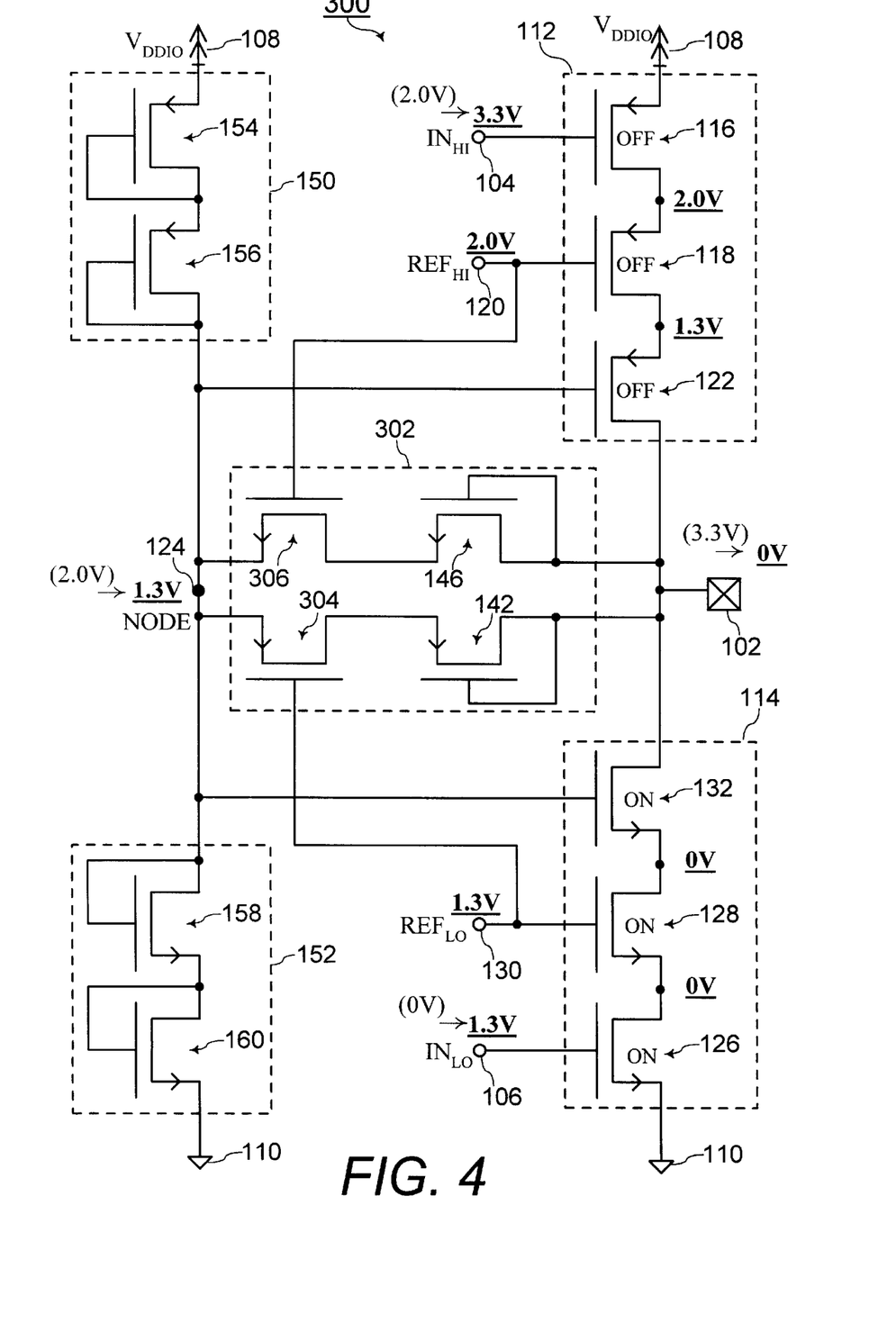
FIG. 4 shows the second embodiment of the present invention as shown in FIG. 3 when the output buffer of the present invention drives the output to a low output voltage.

Alternatively, FIG. 4 shows operation of the output buffer 300 when the output 102 is driven to the low output voltage of 0V. Elements having the same reference number in FIGS. 1, 2, 3, and 4 refer to elements having similar structure and function.

Referring to FIG. 4, as the output 102 discharges down to the low output voltage of 0V, the predetermined node 124 is initially at 2.0V. Because of this large voltage drop of 2.0V across the clamping circuit 302, the diode connected PMOSFET 142 and the reference connected PMOSFET 304 within the clamping circuit 302 turn on to dischage down the predetermined node 124. Because the gate of the reference connected PMOSFET 304 is coupled to the low reference voltage of 1.3V, the predetermined node discharges down toward 1.3V when the reference connected PMOSFET 304 and thus the diode connected PMOSFET 142 turn back off.

Similarly, the voltage across terminals of the other MOSFETs of the output buffer 300 of FIGS. 3 and 4 are limited in a manner as already described in relation to the output buffer 100 of FIGS. 1 and 2, as would be apparent to one of ordinary skill in the art from the description herein. The pull-up stack 112, the pull-down stack 114, the pull-up bleeding circuit 150, and the pull-down bleeding circuit 152 of FIGS. 3 and 4 operate in similar manner as already described in relation with FIGS. 1 and 2, as would be apparent to one of ordinary skill in the art from the description herein.

The foregoing is by way of example only and is not intended to be limiting. The voltage levels mentioned in the description herein are only approximate and are by way of example only. Other voltage levels may be produced with the output buffers of the present invention, as would be apparent to one of ordinary skill in the art from the description herein. The number of MOSFETs within the pull-up stack, the pull-down stack, the clamping circuit, the pull-up bleeding circuit, and the pull-down bleeding circuit are by way of example only. Other number of MOSFETs may be used to produce other voltage levels, as would be apparent to one of ordinary skill in the art from the description herein. Furthermore, the present invention may be used for digital systems and output buffers implemented with any other type of devices, aside from just MOSFETs for example, having similar operating characteristics as MOSFETs, as would be apparent to one of ordinary skill in the art from the description herein. The invention is limited only as defined in the following claims and equivalents thereof.

I claim:

1. An output buffer for driving an output to one of a high output voltage and a low output voltage while limiting voltage across terminals of devices within said output buffer, said output buffer comprising:

a pull-up stack of a first plurality of devices, coupled between a high power supply and the output, which turns on when the output is driven to the high output voltage and which turns off when the output is driven to the low output voltage, wherein a voltage difference between the output and the high power supply is distributed across said first plurality of devices when the output is driven to the low output voltage;

a pull-down stack of a second plurality of devices, coupled between a low power supply and the output, which turns on when the output is driven to the low output voltage and which turns off when the output is driven to the high output voltage, wherein a voltage difference between the output and the low power supply is distributed across said second plurality of devices when the output is driven to the high output voltage; and a clamping circuit, coupled to the output and to a predetermined node of the first and second plurality of devices, for limiting voltage across terminals of each of the first and second plurality of devices by discharging down said predetermined node when the output is driven to the low output voltage and by charging up said predetermined node when the output is driven to the high output voltage;

wherein one of said first plurality of devices of said pull-up stack is coupled to a high voltage input, and wherein one of said second plurality of devices of said pull-down stack is coupled to a low voltage input;

and wherein a set of predetermined low voltages is applied on said high voltage input and said low voltage input when said output is driven to said high output voltage, and wherein a set of predetermined high voltages is applied on said high voltage input and said low voltage input when said output is driven to said low output voltage.

2. The output buffer of claim 1, wherein:

said first plurality of devices of said pull-up stack is comprised of a plurality of PMOSFETs (P-channel Metal Oxide Semiconductor Field Effect Transistors) coupled in series between the high power supply and the output; and wherein the gate of a first PMOSFET of said plurality of PMOSFETs is coupled to said high voltage input, and wherein the gate of a second PMOSFET of said plurality of PMOSFETs is coupled to a high reference voltage, and wherein the gate of a third PMOSFET of said plurality of PMOSFETs is coupled to the clamping circuit at said predetermined node, and wherein the drain of said third PMOSFET is coupled to the output.

3. The output buffer of claim 1, wherein:

said second plurality of devices of said pull-down stack is comprised of a plurality of NMOSFETs (N-channel Metal Oxide Semiconductor Field Effect Transistors) coupled in series between the low power supply and the output; and wherein the gate of a first NMOSFET of said plurality of NMOSFETs is coupled to said low voltage input, and wherein the gate of a second NMOSFET of said plurality of NMOSFETs is coupled to a low reference voltage, and wherein the gate of a third NMOSFET of said plurality of NMOSFETs is coupled to the clamping circuit at said predetermined node, and wherein the drain of said third NMOSFET is coupled to the output.

4. The output buffer of claim 1, wherein said clamping circuit comprises:

a plurality of diode connected PMOSFETs, coupled in series between the output and said predetermined node, that turn on to discharge down said predetermined node when the output is driven to the low output voltage; and a plurality of diode connected NMOSFETs, coupled in series between the output and said predetermined node, that turn on to charge up said predetermined node when the output is driven to the high output voltage.

5. The output buffer of claim 4, wherein said clamping circuit further comprises:

a pull-up bleeding circuit, coupled between the predetermined node and the high power supply, for bleeding charge on to the predetermined node to maintain voltage at the predetermined node above a minimum voltage; and a pull-down bleeding circuit, coupled between the predetermined node and the low power supply, for bleeding charge away from the predetermined node to maintain voltage at the predetermined node below a maximum voltage.

6. The output buffer of claim 5, wherein:
said pull-up bleeding circuit is comprised of a plurality of diode connected PMOSFETs coupled in series between said predetermined node and said high power supply; and
wherein said pull-down bleeding circuit is comprised of a plurality of diode connected NMOSFETs coupled in series between said predetermined node and said low power supply.

7. The output buffer of claim 1, wherein said clamping circuit comprises:
a reference connected PMOSFET, having a source coupled to the predetermined node and having a gate coupled to a low reference voltage;
at least one diode connected PMOSFET, coupled between the output and the drain of said reference connected PMOSFET;
wherein the reference connected PMOSFET and the at least one diode connected PMOSFET turn on to discharge down said predetermined node when the output is driven to the low output voltage;
a reference connected NMOSFET, having a source coupled to the predetermined node and having a gate coupled to a high reference voltage; and
at least one diode connected NMOSFET, coupled between the output and the drain of said reference connected NMOSFET;
wherein the reference connected NMOSFET and the at least one diode connected NMOSFET turn on to charge up said predetermined node when the output is driven to the high output voltage.

8. The output buffer of claim 7, wherein said clamping circuit further comprises:
a pull-up bleeding circuit, coupled between the predetermined node and the high power supply, for bleeding charge on to the predetermined node to maintain voltage at the predetermined node above a minimum voltage; and
a pull-down bleeding circuit, coupled between the predetermined node and the low power supply, for bleeding charge away from the predetermined node to maintain voltage at the predetermined node below a maximum voltage.

9. The output buffer of claim 8, wherein:
said pull-up bleeding circuit is comprised of a plurality of diode connected PMOSFETs coupled in series between said predetermined node and said high power supply; and
wherein said pull-down bleeding circuit is comprised of a plurality of diode connected NMOSFETs coupled in series between said predetermined node and said low power supply.

10. An output buffer for driving an output to one of a high output voltage and a low output voltage while limiting voltage across terminals of each MOSFET (Metal Oxide Semiconductor Field Effect Transistor) within said output buffer, said output buffer comprising:
a pull-up stack of a plurality of PMOSFETs (P-channel Metal Oxide Semiconductor Field Effect Transistors) coupled in series between a high power supply and the output, the plurality of PMOSFETs turning on when the output is driven to the high output voltage and turning off when the output is driven to the low output voltage, wherein a voltage difference between the output and the high power supply is distributed across said plurality of PMOSFETs when the output is driven to the low output voltage;
wherein the gate of a first PMOSFET of said plurality of PMOSFETs is coupled to a high voltage input, and wherein the gate of a second PMOSFET of said plurality of PMOSFETs is coupled to a high reference voltage, and wherein the drain of a third PMOSFET of said plurality of PMOSFETs is coupled to the output;
a pull-down stack of a plurality of NMOSFETs (N-channel Metal Oxide Semiconductor Field Effect Transistors) coupled in series between a low power supply and the output, said plurality of NMOSFETs turning on when the output is driven to the low output voltage and tuning off when the output is driven to the high output voltage, wherein a voltage difference between the output and the low power supply is distributed across said plurality of NMOSFETs when the output is driven to the high output voltage;
wherein the gate of a first NMOSFET of said plurality of NMOSFETs is coupled to a low voltage input, and wherein the gate of a second NMOSFET of said plurality of NMOSFETs is coupled to a low reference voltage, and wherein the drain of a third NMOSFET of said plurality of NMOSFETs is coupled to the output;
and wherein a set of predetermined low voltages is applied on said high voltage input and said low voltage input when said output is driven to said high output voltage, and wherein a set of predetermined high voltages is applied on said high voltage input and said low voltage input when said output is driven to said low output voltage; and
a clamping circuit, coupled to the output and to a predetermined node that is coupled to the gate of said third PMOSFET and the gate of said third NMOSFET, for limiting voltage across terminals of each of the plurality of said PMOSFETs and said NMOSFETs by discharging down said predetermined node when the output is driven to the low output voltage and by charging up said predetermined node when the output is driven to the high output voltage, wherein the clamping circuit comprises:
at least one diode connected PMOSFET, coupled between the output and said predetermined node, that turns on to discharge down said predetermined node when the output is driven to the low output voltage;
at least one diode connected NMOSFET, coupled between the output and said predetermined node, that turns on to charge up said predetermined node when the output is driven to the high output voltage;
a pull-up bleeding circuit, comprised of a plurality of diode connected PMOSFETs coupled in series between the predetermined node and the high power supply, for bleeding charge on to the predetermined node to maintain voltage at the predetermined node above a minimum voltage; and
a pull-down bleeding circuit, comprised of a plurality of diode connected NMOSFETs coupled in series between the predetermined node and the low power supply, for bleeding charge away from the predetermined node to maintain voltage at the predetermined node below a maximum voltage.

11. A method for driving an output with an output buffer to one of a high output voltage and a low output voltage while limiting voltage across terminals of devices within the output buffer, the method including the steps of:
turning on a pull-up stack of a first plurality of devices when the output is driven to the high output voltage and turning off said pull-up stack of the first plurality of devices when the output is driven to the low output voltage, wherein said pull-up stack of the first plurality of devices is coupled between a high power supply and the output such that a voltage difference between the output and the high power supply is distributed across said first plurality of devices when the output is driven to the low output voltage;

turning on a pull-down stack of a second plurality of devices when the output is driven to the low output voltage and turning off said pull-down stack of the second plurality of devices when the output is driven to the high output voltage, wherein said pull-down stack of the second plurality of devices is coupled between a low power supply and the output such that a voltage difference between the output and the low power supply is distributed across said second plurality of devices when the output is driven to the high output voltage;

limiting voltage across terminals of each of the first and second plurality of devices by discharging down a predetermined node, coupled to the first and second plurality of devices, when the output is driven to the low output voltage and by charging up said predetermined node when the output is driven to the high output voltage;

wherein one of said first plurality of devices of said pull-up stack is coupled to a high voltage input, and wherein one of said second plurality of devices of said pull-down stack is coupled to a low voltage input;

applying a set of predetermined low voltages on said high voltage input and said low voltage input when said output is driven to said high output voltage; and applying a set of predetermined high voltages on said high voltage input and said low voltage input when said output is driven to said low output voltage.

12. The method of claim 11, wherein:

said first plurality of devices of said pull-up stack is comprised of a plurality of PMOSFETs (P-channel Metal Oxide Semiconductor Field Effect Transistors) coupled in series between the high power supply and the output; and wherein the gate of a first PMOSFET of said plurality of PMOSFETs is coupled to said high voltage input, and wherein the gate of a second PMOSFET of said plurality of PMOSFETs is coupled to a high reference voltage, and wherein the gate of a third PMOSFET of said plurality of PMOSFETs is coupled to said predetermined node, and wherein the drain of said third PMOSFET is coupled to the output.

13. The method of claim 11, wherein:

said second plurality of devices of said pull-down stack is comprised of a plurality of NMOSFETs (N-channel Metal Oxide Semiconductor Field Effect Transistors) coupled in series between the low power supply and the output; and wherein the gate of a first NMOSFET of said plurality of NMOSFETs is coupled to said low voltage input, and wherein the gate of a second NMOSFET of said plurality of NMOSFETs is coupled to a low reference voltage, and wherein the gate of a third NMOSFET of said plurality of NMOSFETs is coupled to said predetermined node, and wherein the drain of said third NMOSFET is coupled to the output.

14. The method of claim 11, wherein said step of limiting further includes the steps of:

turning on a plurality of diode connected PMOSFETs, coupled in series between the output and said predetermined node, to discharge down said predetermined node when the output is driven to the low output voltage; and turning on a plurality of diode connected NMOSFETs, coupled in series between the output and said predetermined node, to charge up said predetermined node when the output is driven to the high output voltage.

15. The method of claim 14, wherein said step of limiting further includes the steps of:

bleeding charge via a pull-up bleeding circuit on to the predetermined node from the high power supply to maintain voltage at the predetermined node above a minimum voltage; and bleeding charge via a pull-down bleeding circuit away from the predetermined node and to the low power supply to maintain voltage at the predetermined node below a maximum voltage.

16. The method of claim 11, wherein said step of limiting further includes the steps of:

turning on a reference connected PMOSFET and at least one diode connected PMOSFET to discharge down said predetermined node when the output is driven to the low output voltage, wherein the source of the reference connected PMOSFET is coupled to the predetermined node and wherein the gate of the reference connected PMOSFET is coupled to a low reference voltage, and wherein the at least one diode connected PMOSFET is coupled between the output and the drain of the reference connected PMOSFET; and turning on a reference connected NMOSFET and at least one diode connected NMOSFET to charge up said predetermined node when the output is driven to the high output voltage, wherein the source of the reference connected NMOSFET is coupled to the predetermined node and the gate of the reference connected NMOSFET is coupled to a high reference voltage, and wherein the at least one diode connected NMOSFET is coupled between the output and the drain of the reference connected NMOSFET.

17. The method of claim 16, wherein said step of limiting further includes the steps of:

bleeding charge via a pull-up bleeding circuit on to the predetermined node from the high power supply to maintain voltage at the predetermined node above a minimum voltage; and bleeding charge via a pull-down bleeding circuit away from the predetermined node and to the low power supply to maintain voltage at the predetermined node below a maximum voltage.

18. An output buffer for driving an output to one of a high output voltage and a low output voltage while limiting voltage across terminals of devices within said output buffer, said output buffer comprising:

means for driving the output to the high output voltage by conducting current between a high power supply and the output;

means for driving the output to the low output voltage by conducting current between a low power supply and the output; and means for limiting voltage across terminals of each of the devices within the output buffer by discharging down a predetermined node within the output buffer when the output is driven to the low output voltage and by charging up said predetermined node when the output is driven to the high output voltage;

wherein the means for driving the output to the high output voltage comprises:

a pull-up stack of a first plurality of devices, coupled between the high power supply and the output, which turns on when the output is driven to the high output voltage and which turns off when the output is driven to the low output voltage, wherein a voltage difference between the output and the high power supply is distributed across said first plurality of devices when the output is driven to the low output voltage, and wherein the means for driving the output to the low output voltage comprises:

a pull-down stack of a second plurality of devices, coupled between the low power supply and the output, which turns on when the output is driven to the low output voltage and which turns off when the output is driven to the high output voltage, wherein a voltage difference between the output and the low power supply is distributed across said second plurality of devices when the output is driven to the high output voltage;

and wherein one of said first plurality of devices of said pull-up stack is coupled to a high voltage input, and wherein one of said second plurality of devices of said pull-down stack is coupled to a low voltage input;

and wherein a set of predetermined low voltages is applied on said high voltage input and said low voltage input when said output is driven to said high output voltage, and wherein a set of predetermined high voltages is applied on said high voltage input and said low voltage input when said output is driven to said low output voltage.

19. The output buffer of claim 18, wherein the means for limiting comprises:

a clamping circuit, coupled to the output and to said predetermined node that is coupled to the first and second plurality of devices, for limiting voltage across terminals of each of the first and second plurality of devices by discharging down said predetermined node when the output is driven to the low output voltage and by charging up said predetermined node when the output is driven to the high output voltage.

* * * * *